(12) United States Patent
Wu

(10) Patent No.: US 8,859,910 B2
(45) Date of Patent: Oct. 14, 2014

(54) CIRCUIT BOARD WITH SIGNAL ROUTING LAYER HAVING CONSISTENT IMPEDANCE

(71) Applicant: Hon Hai Precision Industry Co., Ltd., New Taipei (TW)

(72) Inventor: Kai-Wen Wu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/756,995

(22) Filed: Feb. 1, 2013

(65) Prior Publication Data

US 2014/0138127 A1 May 22, 2014

(30) Foreign Application Priority Data

Nov. 22, 2012 (TW) .............................. 101143813 A

(51) Int. Cl.
| | |
|---|---|
| H05K 1/03 | (2006.01) |
| H05K 1/11 | (2006.01) |
| H05K 7/00 | (2006.01) |
| B23B 7/00 | (2006.01) |
| H05K 1/02 | (2006.01) |

(52) U.S. Cl.
CPC ... H05K 1/02 (2013.01); H05K 1/03 (2013.01)
USPC .......... 174/256; 174/255; 174/261; 361/777; 361/779; 361/794; 428/209

(58) Field of Classification Search
USPC .......... 174/255, 256, 261; 361/777, 779, 794; 428/209
See application file for complete search history.

(56) References Cited

U.S. PATENT DOCUMENTS

| | | | | |
|---|---|---|---|---|
| 5,184,095 | A * | 2/1993 | Hanz et al. ....................... | 333/33 |
| 5,316,831 | A * | 5/1994 | Nakajima et al. ............. | 428/209 |
| 5,541,369 | A * | 7/1996 | Tahara et al. .................. | 174/268 |
| 5,604,017 | A * | 2/1997 | Frankosky ..................... | 428/209 |
| 6,340,797 | B1 * | 1/2002 | Yoshida et al. ............... | 174/260 |
| 6,459,049 | B1 * | 10/2002 | Miller et al. ................... | 174/261 |
| 2013/0180762 | A1 * | 7/2013 | Moul et al. ..................... | 174/251 |

* cited by examiner

*Primary Examiner* — Timothy Thompson
*Assistant Examiner* — Sherman Ng
(74) *Attorney, Agent, or Firm* — Novak Druce Connolly Bove + Quigg LLP

(57) ABSTRACT

A circuit board includes a dielectric layer and a signal routing layer on the dielectric layer. The signal routing layer includes chip traces, connector traces, and signal traces connected with the chip traces and the connector traces. The dielectric layer includes a signal trace area for arraying the signal traces, a chip trace area for arraying the chip traces, and a connector trace area for arraying the connector traces. The dielectric coefficient of the signal trace area is smaller than the dielectric coefficient of the chip trace area and greater than the dielectric coefficient of the connector trace area.

10 Claims, 2 Drawing Sheets

CIRCUIT BOARD WITH SIGNAL ROUTING LAYER HAVING CONSISTENT IMPEDANCE

BACKGROUND

1. Technical Field

The present disclosure relates to circuit boards and, particularly, to a circuit board with signal routing layer having consistent impedance.

2. Description of Related Art

Trace impedances of circuit boards must be kept constant throughout all the traces for good signal transmitting ability. Yet, at some positions of the trace, for example, the impedance at which is connected to a connector may be smaller than impedance at which is connected to a chip.

Therefore, it is desirable to provide a circuit board, which can overcome the limitation described.

BRIEF DESCRIPTION OF THE DRAWINGS

The components of the drawings are not necessarily drawn to scale, the emphasis instead being placed upon clearly illustrating the principles of the embodiments of the present disclosure. Moreover, in the drawings, like reference numerals designate corresponding parts throughout several views, and all the views are schematic.

DETAILED DESCRIPTION

Figure 1:
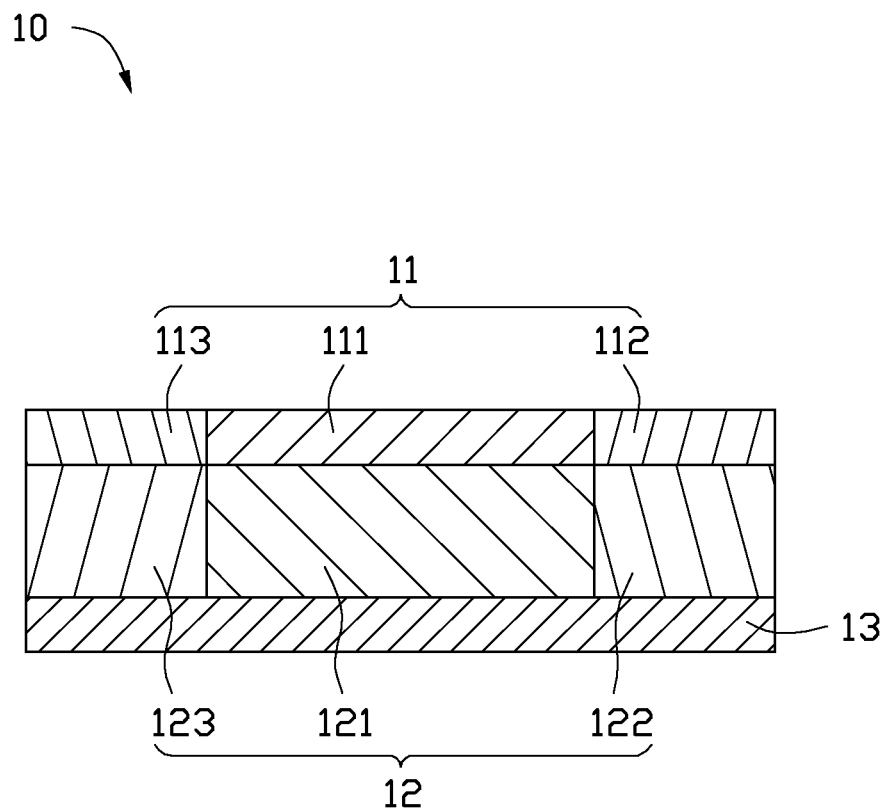
FIG. 1 is a schematic, sectional view of a circuit board with signal routing layer having consistent impedance of an embodiment.
Figure 2:
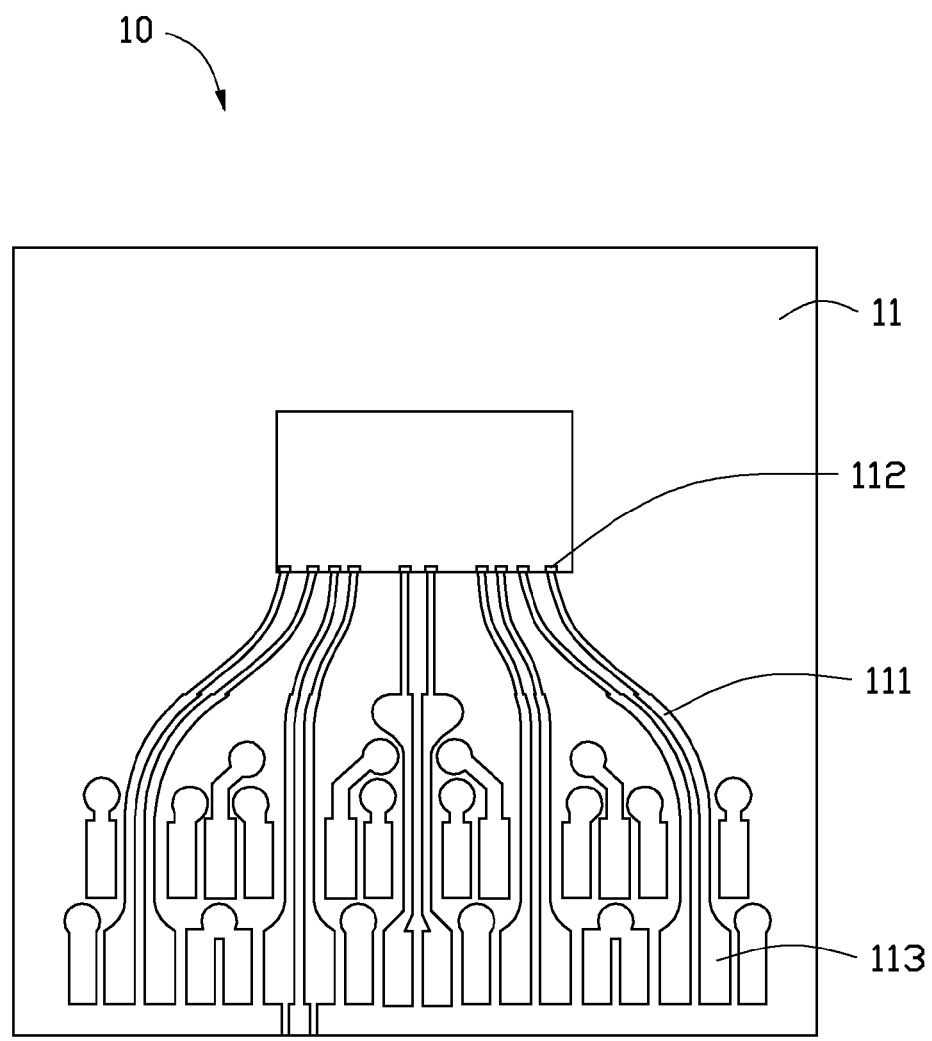
FIG. 2 is a schematic view of signal routing layer of the circuit board with signal routing layer having consistent impedance shown in FIG. 1.

FIGS. 1 to 2 show a circuit board with signal routing layer having consistent impedance 10 of an embodiment. The circuit board 10 includes a signal routing layer 11, a dielectric layer 12, and a ground layer 13. In this embodiment, the signal routing layer 11 is used to describe all conductor wires arrayed on the circuit board 10.

In the practical requirement, the circuit board 10 also includes conductor layers. In this embodiment, the conductor layer is not shown in the FIG. 1.

The signal routing layer 11 and the ground layer 13 are located on two surfaces of the dielectric layer 12. In other words, the dielectric layer 12 is sandwiching the signal routing layer 11 and the ground layer 13.

The signal routing layer 11 is configured for arraying electronic components, such as BGAs, resistances, or capacitances, for example. The signal routing layer 11 includes a plurality of signal traces 111, a plurality of chip traces 112, and a plurality of connector traces 113. The signal trace 111 is connected with the chip trace 112 and the connector trace 113. The chip traces 112 are connected with a chip, such as CPU. The connector traces 113 are located with a connector, such as USB connector.

Each of the signal traces 111 is a single strip. Each of the chip traces 112 is also a single strip. Each of the connector traces 113 is another single strip. The width of each signal trace 111 is different in different positions of the signal trace 111. The width of each signal trace 111 near the chip traces 112 is smaller than the width of each signal trace 111 near the connector traces 113, thus, the impedance of each signal trace 111 near the chip traces 112 is bigger than the impedance of each signal trace 111 near the connector traces 113.

The dielectric layer 12 is configured for supporting the signal routing layer 11. The dielectric layer 12 is made up of insulating material. In this embodiment, the dielectric layer 12 is made of fiberglass mixed with resin.

The dielectric layer 12 includes a signal trace area 121, a chip trace area 122, and a connector trace area 123. The signal trace area 121 is configured for arraying the signal traces 111, the chip trace area 122 is configured for fixing the chip traces 112, and the connector trace area 123 is configured for locating the connector traces 113. The dielectric coefficient of the connector trace area 123 is the smallest of the dielectric layer 12 and the dielectric coefficient of the chip trace area 122 is the greatest of the dielectric layer 12. In other words, the dielectric coefficient of the signal trace area 121 is smaller than the dielectric coefficient of the chip trace area 122 and greater than the dielectric coefficient of the connector trace area 123.

Various methods for increasing the dielectric coefficient of the dielectric layer 12 in the chip trace area 122 can be used. For example, in one method, when the dielectric layer 12 is made of fiberglass mixed with resin, because the dielectric coefficient of the fiberglass is greater than the dielectric coefficient of the resin, a weight ratio of the fiberglass in the mixture of fiberglass and resin used in the chip trace area 122 is larger than that in other area of the dielectric layer 12.

In another method, ceramic powder is added into the mixture of fiberglass and resin used in the chip trace area 122.

Because of the dielectric coefficient of the chip trace area 122 is greater than the dielectric coefficient of the connector trace area 123, the impedance of the signal traces 111 near the chip trace area 122 is reduced and the impedance of the signal traces 111 near the connector trace area 123 is increased, so the impedance of the signal routing layer 11 is consistent for an excellent signal transmitting ability.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A circuit board, comprising:
   a signal routing layer, comprising a plurality of connector traces, a plurality of chip traces, and a plurality of signal traces connected with the connector traces and the chip traces;
   a dielectric layer, being configured for supporting the signal routing layer, the dielectric layer comprising a signal trace area where the signal traces are arrayed, a chip trace area where the chip traces are arrayed, and a connector trace area where the connector traces are arrayed;
   wherein a dielectric coefficient of the signal trace area is smaller than a dielectric coefficient of the chip trace area and greater than a dielectric coefficient of the connector trace area.

2. The circuit board of claim 1, wherein a width of each of the signal traces near the chip traces is smaller than a width of each of the signal traces near the connector traces.

3. The circuit board of the claim 1, wherein the dielectric layer is made of fiberglass mixed with resin.

4. The circuit board of the claim 3, wherein a weight ratio of the fiberglass to the resin in the chip trace area of the dielectric layer is greater than the weight ratio of the fiberglass to the resin in the connector trace area of the dielectric layer.

5. The circuit board of the claim 3, wherein the chip trace area of the dielectric layer comprises ceramic powder.

6. The circuit board of the claim 1, wherein the circuit board comprises a ground layer located on the dielectric layer.

7. The circuit board of the claim 1, wherein each of the signal traces is a single strip.

8. The circuit board of the claim 7, wherein each of the chip traces is a single strip.

9. The circuit board of the claim 8, wherein each of the connector traces is a single strip.

10. The circuit board of the claim 9, wherein each of the signal traces is directly connected to a respective one of the chip traces and a respective one of the connector traces.

\* \* \* \* \*